(12) United States Patent
Schulz et al.

(10) Patent No.: US 6,822,872 B2
(45) Date of Patent: Nov. 23, 2004

(54) HOUSING FOR RECEIVING A COMPONENT WHICH CAN BE CONNECTED TO THE HOUSING IN A PLUGGABLE MANNER

(75) Inventors: Klaus Schulz, Berlin (DE); Andreas Stockhaus, Berlin (DE)

(73) Assignee: Infineon Technologies AG, Munich (DE)

(*) Notice: Subject to any disclaimer, the term of this patent is extended or adjusted under 35 U.S.C. 154(b) by 311 days.

(21) Appl. No.: 09/761,596

(22) Filed: Jan. 16, 2001

(65) Prior Publication Data
US 2004/0070953 A1 Apr. 15, 2004

(30) Foreign Application Priority Data
Jan. 15, 2001 (DE) .......................................... 101 02 453

(51) Int. Cl.⁷ ................................................. H05K 7/00
(52) U.S. Cl. ...................... 361/747; 759/801; 759/816; 759/818; 759/753; 759/799
(58) Field of Search ................................ 361/799, 800, 361/801, 802, 816, 818, 752, 753, 728, 731, 732, 740, 741, 747, 756, 759, 733, 786, 787; 174/35 R, 35 GC; 439/607, 609–610, 357, 358, 923, 939, 155, 152

(56) References Cited

U.S. PATENT DOCUMENTS 4,747,570 A    5/1988   Takahashi
6,368,154 B1 *  4/2002   Hirata et al. ................. 439/609
6,517,382 B2 *  2/2003   Flickinger et al. ........... 439/607

FOREIGN PATENT DOCUMENTS

| DE | 37 24 620 A1 | 2/1989 |
| DE | 2 336 248 A | 10/1999 |
| DE | 198 43 627 A1 | 4/2000 |
| DE | 198 43 628 A1 | 4/2000 |
| DE | 198 43 708 A1 | 4/2000 |
| DE | 198 47 843 A1 | 5/2000 |

* cited by examiner

Primary Examiner—Phuong T. Vu
(74) Attorney, Agent, or Firm—Laurence A. Greenberg; Werner H. Stemer; Ralph E. Locher

(57) ABSTRACT

The invention pertains to housing for receiving a component which can be connected to the housing in a pluggable manner, in particular an optoelectronic transceiver, the housing having at least one pressing spring, which is deflected when the component is inserted. According to the invention it is provided that the at least one pressing spring (71, 72) tapers in its width in the direction of the interior of the housing. It is preferably of a trapezoidal design. Higher spring forces can be realized with it and it is ensured that a component which is plugged into the housing can be removed from the housing in a safe and reliable manner during unlocking of the housing.

11 Claims, 3 Drawing Sheets

HOUSING FOR RECEIVING A COMPONENT WHICH CAN BE CONNECTED TO THE HOUSING IN A PLUGGABLE MANNER

BACKGROUND OF THE INVENTION

Field of the Invention

The invention relates to a housing for receiving a component which can be connected to the housing in a pluggable manner, in particular an optoelectronic transceiver.

It is known to arrange optoelectronic transceivers on a printed-circuit board and connect them to an optical network by means of optical plug-in connectors. Known in particular are so-called small-form-factor-pluggable (SFP) transceivers of a small type, which are of a pluggable design (so-called "detachable transceivers") and can be plugged into a receptacle of a housing mounted onto the printed-circuit board.

A corresponding housing 1 is represented in FIG. 5. The housing comprises an upper part (top cage) 22 and a lower part (bottom cage) 21, which can be connected to each other in an engageable manner and form a receiving housing into which a transceiver can be plugged or from which a transceiver can be unplugged in the direction of the double-headed arrow A-B. At the same time, the housing 1 preferably serves as a shielding plate for the electromechanical shielding of the pluggable transceiver.

The lower part 21 of the housing is fastened on a printed-circuit board 3. Both parts of the housing 21, 22 protrude through a cutout in a metallic rear wall (not represented), which is electrically connected to the housing via contact springs 11. Also mounted within the housing and directly on the printed-circuit board 3 is an electrical plug 4, by means of which the plugged-in transceiver can be connected to the printed-circuit board 3 and into which the transceiver is inserted during plugging into the housing 1.

During plugging of a transceiver into the housing 1, rectangular pressing springs 51, 52 formed in the region of the rear end face of the lower part 21 of the housing are prestressed. Locking of the transceiver in the housing takes place by means of a locking clip 6, which is formed in the front region of the lower part 21 of the housing and into which a locking lug of the transceiver can engage. During unlocking of the transceiver by pressing down of the resiliently formed fastening clip 6, the transceiver is pressed out of the housing 1 by the prestressed pressing springs 51, 52. The rectangular ejecting springs 51, 52 are represented in front view in FIG. 6.

A disadvantage of the known housing is that the spring forces achieved by stressing of the pressing springs 51, 52 are not adequate to ensure in a dependable way that the transceiver is pressed out of the housing 1 when it is unlocked. In particular, the transceiver is pressed only a small distance out of the housing on account of frictional forces between the housing and the transceiver during unlocking.

SUMMARY OF THE INVENTION

The present invention is based on the object of providing a housing for receiving a component which can be connected to the housing in a pluggable manner which ensures that the component is dependably and reliably pressed out of the housing when it is unlocked.

Accordingly, it is provided according to the invention that at least one pressing spring of the housing is designed in such a way that it tapers in its width in the direction of the interior of the housing. A spring form of this type has the advantage that higher spring forces can be realized with it: the restoring force or spring force is greater than in the case of a rectangular design of the pressing spring known in the prior art. This results from a more uniform bending stress of the spring material which accompanies the reduction in the width of the spring in the direction of the interior of the housing. In particular, the tapering spring bends in a form approximating that of a circle, while a rectangular spring bends in the form of a parabola. However, circular bending entails a higher amount of spring work and energy storage.

A further advantage of using a spring tapering in its width is that less space is taken up by the spring inside the housing. One result of this is the possibility of extending the length of the spring in the direction of the interior of the housing, allowing for example the end of the spring to protrude beyond an electrical plug arranged in the housing. By extending the length of the spring, higher spring forces can also be realized. Another result is the possibility of making an electrical plug arranged in the housing or other components arranged in the housing larger and consequently easier to handle.

In a preferred development of the invention, the pressing spring is of a trapezoidal design. The two parallel sides of the pressing spring in this case run parallel to the lateral walls of the housing. On account of the tapering of the pressing spring in the direction of the interior of the housing, the parallel side running in the interior of the housing has a smaller width than the side running along the wall of the housing. A trapezoidal design of the spring has the advantage that it is simple to produce, since the corresponding edges of the metal plate can be worked in straight lines.

It is likewise within the scope of the invention for the pressing spring to be of a triangular or else parabolic design. In the case of a triangular design, it is preferred to provide the form of an isosceles triangle, the base of which runs along the wall of the housing and the corner of which, formed by the equal sides, lies in the interior of the housing. Similarly, in the case of a parabolic design of the pressing spring, the inflection point of the parabola lies in the interior of the housing.

In the preferred embodiment, the pressing spring is designed as a rear continuation of the plate of the housing, with respect to the plugging-in direction of the component, bent around by more than 90° into the interior of the housing. This is a simple way of providing an integral design of the spring with the housing which can be easily produced.

The housing is preferably designed in such a way that it has an upper part and a lower part, which can be connected to the printed-circuit board. The pressing spring is in this case preferably articulated on the lower part.

Preferably, two pressing springs are articulated on the right-hand and left-hand walls of the housing in a symmetrical arrangement, to be precise in each case in the upper region of the wall of the housing. This ensures that the pressing springs are freely accessible and are not concealed by other components arranged in the housing, such as a plug connected to the printed-circuit board.

The legs of the pressing spring articulated on the housing preferably terminate flush with the upper edge of the housing. This provides a maximum size of the spring toward the upper edge of the housing.

DESCRIPTION OF THE PREFERRED EMBODIMENT

Figure 1:
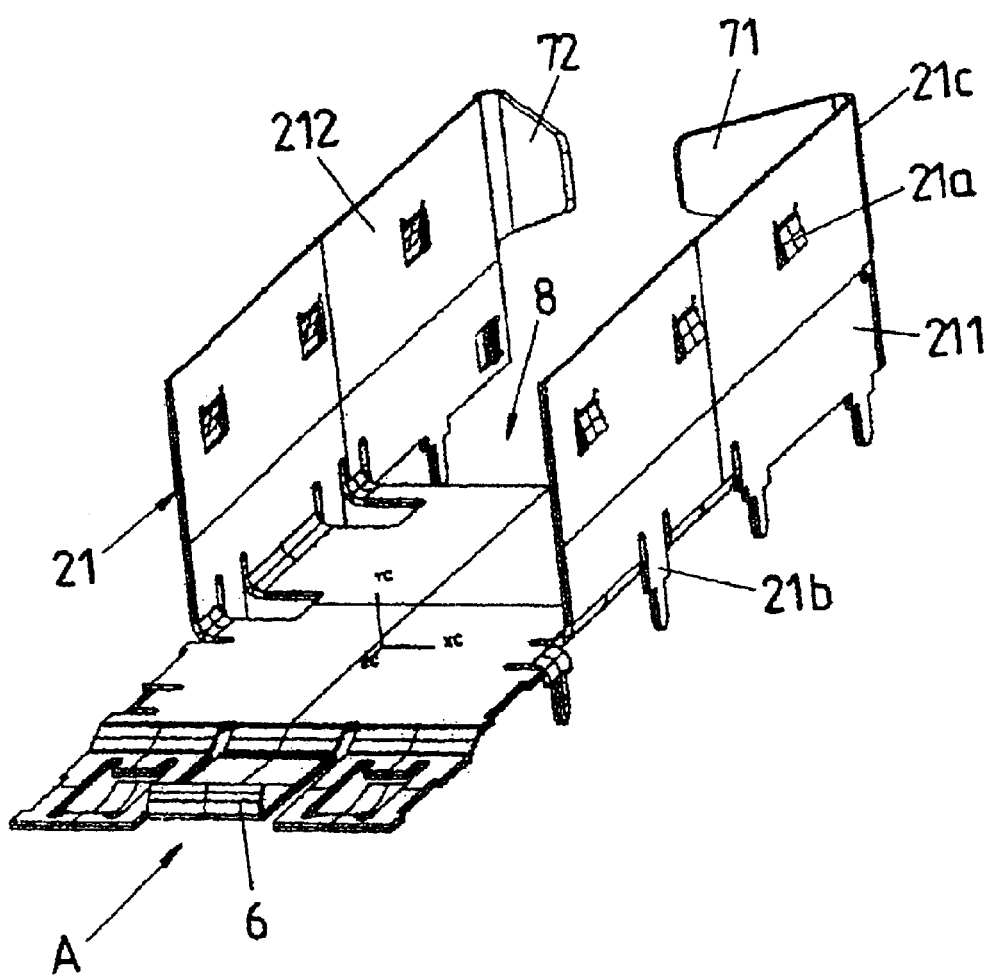
FIG. 1 shows a perspective view of a lower part of the housing according to the invention.
Figure 5:
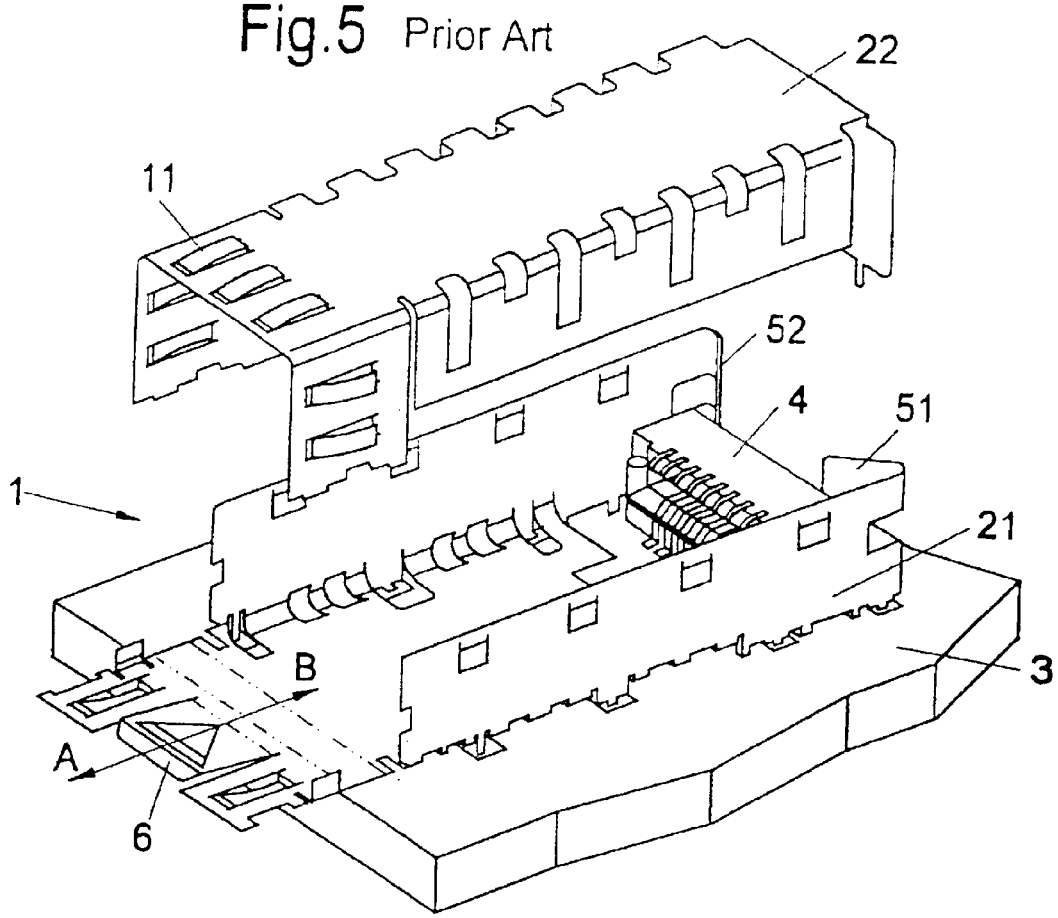
FIG. 5 shows a perspective representation of a housing known in the prior art.
Figure 6:
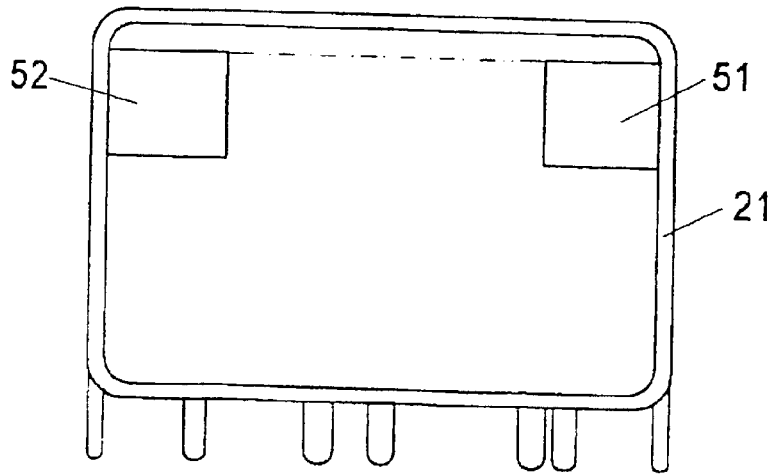
FIG. 6 shows a front view of the housing of FIG. 5.

FIG. 1 shows the lower part 21 of a housing according to the invention, which can be connected to an upper part of the housing according to FIG. 5 by means of locking clips 21a. Downwardly protruding fastening pins 21b serve for fastening the housing on a printed-circuit board (not represented). The bottom of the lower part 21 of the housing has in the rear region a clearance 8, in which an electrical plug corresponding to the plug 4 of FIG. 5 is fastened on the printed-circuit board.

In the front region of the lower part 21 there is formed, in turn, a locking clip 6, which serves for the locking of a transceiver plugged into the housing.

Figure 2:
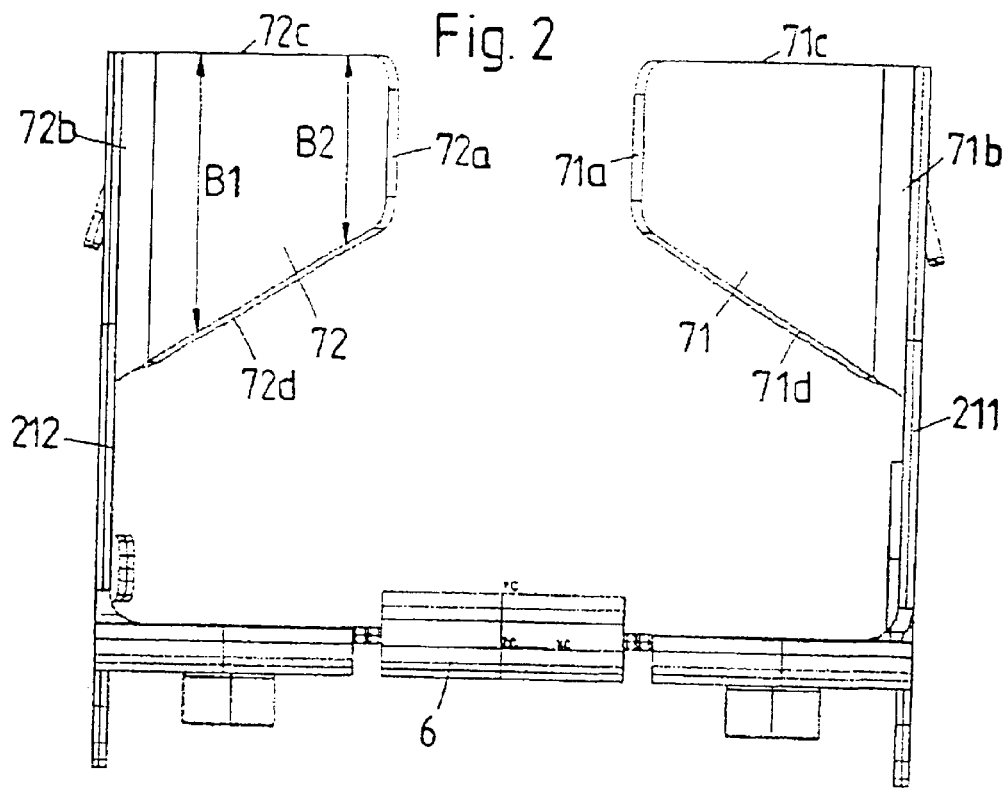
FIG. 2 shows a front view of the housing of FIG. 1.

The housing according to FIGS. 1, 2 differs from the known housing of FIG. 5 essentially by the design of the pressing or ejecting springs. For instance, formed onto the rear edge 21c of the lateral walls 211, 212 of the housing are two pressing springs 71, 72 which have a trapezoidal form. This can be seen in particular in the front view of FIG. 2. In this case, according to FIG. 2, each pressing spring 71, 72 has essentially parallel sides 71a, 71b and 72a, 72b, respectively, of which the longer side is in each case articulated on the lateral wall 211, 212 of the housing. The two other sides 71c, 71d and 72c, 72d, respectively, do not run parallel, the upper side 71c, 72c terminating flush with the upper side of the lateral wall 211, 212 of the housing and extending in the transverse direction at right angles with respect to the wall.

The width of the pressing springs 71, 72, reducing in the direction of the interior of the housing, is represented in FIG. 2 in the case of one pressing spring 72 by way of example by two widths B1, B2.

The trapezoidal ejecting springs 71, 72 are integrally formed with the wall 211 of the housing and designed as continuations of the wall of the housing which are bent around by more than 90° into the interior of the housing to produce a spring effect A transceiver is pushed in the direction A into the lower part 21 of the housing or the pushing-in opening into the housing formed by the upper part of the housing and the lower part of the housing. The front edges of the transceiver thereby come into contact with the lateral edges 71a, 72a of the pressing springs 71, 72 and press them away toward the rear, thereby creating a prestressing effect. After locking of the transceiver by means of the locking clip 6, the transceiver is locked in the housing under prestress.

When the locking clip 6 is actuated, the pressing springs 71, 72 are relieved and they press the transceiver out of the housing.

Given the same plate thickness and the same leg height, the restoring force or ejecting force provided by the restoring springs 71, 72 is in this case greater in the region of the wall 21 of the housing than when the rectangular pressing springs are used. This is to do with the fact that there is an approximately equal bending stress of the spring material in every cross section of the spring on account of the decreasing width of the springs in the direction of the interior of the housing.

The housing and the pressing springs preferably consist of a metallic material, in particular of metal plate. In applications in which an electromagnetic shielding of the component inserted into the housing is not required or is provided by other structures, the use of a non-metallic material is also conceivable however. It is also conceivable, for example, to produce the housing from plastic and to form metallic restoring springs on it.

Figure 3:
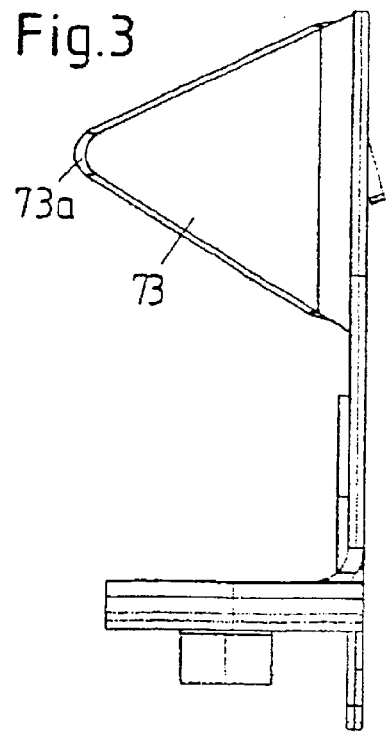
FIG. 3 shows a first alternative design of a pressing spring according to the invention.

An alternative configuration of a pressing spring according to the invention is represented in FIG. 3. According to this, the pressing spring 73 is of a triangular design, one corner 73a protruding into the interior of the housing.

Figure 4:
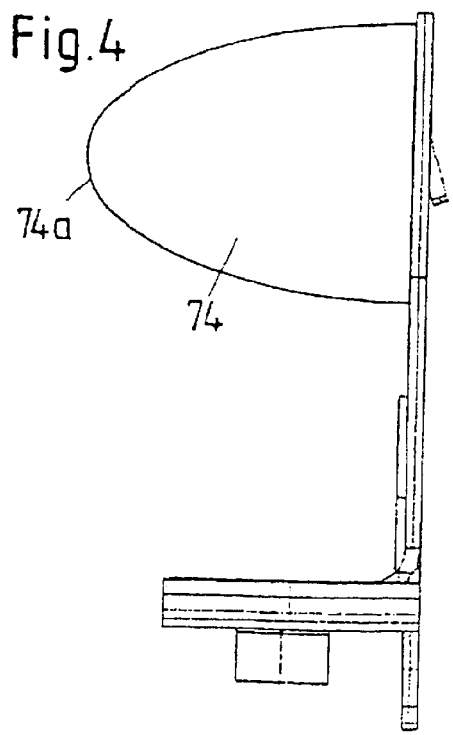
FIG. 4 shows a second alternative design of a pressing spring according to the invention.

In FIG. 4, the pressing spring 74 is of a parabolic design, the inflection point 74a lying in the interior of the housing.

The invention is not restricted in its execution to the exemplary embodiments represented. All that is essential for the invention is that at least one pressing spring which tapers in its width in the direction of the interior of the housing and serves for the resilient reception of a component is provided in the interior of the housing.

What is claimed is:

1. A housing for pluggably receiving a component, the housing comprising:
    a housing part forming an interior for pluggably receiving a component; and
    at least one pressing spring that is deflected when the component is inserted into said interior of said housing part creating a prestress opposite a direction of insertion opposing the insertion of said component, said at least one pressing spring having a length and a width that tapers as said length extends into said interior of said housing part.

2. The package according to claim 1, wherein said pressing spring is designed in a trapezoidal shape.

3. The package according to claim 2, wherein:
    said package part has side walls; and
    said pressing spring has two parallel sides running parallel to said side walls of said package part.

4. The package according to claim 1, wherein said pressing spring is designed in a shape selected from the group consisting of a triangular shape and a parabolic shape.

5. The package according to claim 1, wherein:

said package part has a first end and a second end remote from said first end;

said first end defines a location for pluggably receiving the component;

said pressing spring is designed as a continuation of said package part at said second end; and said pressing spring is bent around by more than 90° degrees into said interior of said package part.

6. The package according to claim 5, wherein said continuation is formed integrally with said package part.

7. The package according to claim 1, wherein:

said package part includes an upper part and a lower part designed for connection to a printed-circuit board; and said pressing spring is articulated on said lower part.

8. The package according to claim 1, wherein:

said package part includes a right-hand wall and a left-hand wall;

said at least one pressing spring includes a first pressing spring articulated on said right-hand wall of said package part and a second pressing spring articulated on said left-hand wall of said package part.

9. The package according to claim 8, wherein:

said right-hand wall includes an upper region and said left-hand wall includes an upper region;

said first pressing spring is articulated in said upper region of said right-hand wall; and said second pressing spring is articulated in said upper region of said left-hand wall.

10. The package according to claim 9, wherein:

said package part has an upper edge;

said first pressing spring has a leg articulated on said right-hand wall and terminating flush with said upper edge of said package part; and said second pressing spring has a leg articulated on said left-hand wall and terminating flush with said upper edge of said package part.

11. The package according to claim 1, wherein the component is an optoelectronic transceiver.

* * * * *